April 16, 1963

F. E. BARON 3,086,149

ENCAPSULATED ASSEMBLIES

Filed Sept. 27, 1960

INVENTOR.
Frank E. Baron
BY
Johnson and Kline
ATTORNEYS

United States Patent Office 3,086,149
Patented Apr. 16, 1963

3,086,149
ENCAPSULATED ASSEMBLIES

Frank E. Baron, Monroe, Conn., assignor to Vitramon, Incorporated, Monroe, Conn., a corporation of Delaware Filed Sept. 27, 1960, Ser. No. 58,803
5 Claims. (Cl. 317—242)

This invention relates to electrical components, such as capacitors, transistors, resistors, thermistors and the like. More specifically, it pertains to assemblies in which such components are encapsulated to form compact, rugged insulated units.

It is an object of the invention to provide an encapsulated assembly, including an electrical component, in which the component body is predeterminately positioned within the casing and the leads are maintained in predetermined relation relative to one another. The term component as used herein includes, not only single electrical units such as transistors, resistors, thermistors and capacitors or the like, but includes combinations thereof.

It is also an object of the invention to provide an encapsulated electrical component assembly in which the manufacture thereof is facilitated by cooperation between the encapsulated component and the casing during assembly operations which simultaneously properly positions the component within the casing and maintains a predetermined physical relationship between the component leads.

Another object of the invention is to provide an encapsulated assembly, including an electrical component, in which divergent means forming part of the casing complement and the engageable with divergent means associated with the component body when the latter is inserted in the casing for properly positioning the body and supporting the leads against movement out of predetermined relationship.

Another object of the invention is to provide an encapsulated electrical component assembly in which the lead wires projecting from the component body are formed with angularly divergent portions and the casing is formed with angularly divergent portions complementary to and engageable with the divergent portions of the leads, whereby, when the component is inserted in the casing, the divergent portions of the leads and casing engage and cooperate to properly position the component within the casing and maintain a predetermined physical relationship between the leads.

It is further an object of the invention to provide an encapsulated electrical component assembly in which the lead wires are spaced a predetermined amount for use in printed circuits or the like and in which the sides of the casing are in alignment with the axes of the lead wires, the casing cooperating and being engageable with a portion of the lead wires for centering the component within the casing and maintaining the predetermined relationship between the leads.

It is still further an object of the invention to provide an encapsulated electrical component assembly which is of simple, compact structure, can readily be manufactured by modern production methods and is of such rugged character it will function over a long period of time, under varying field conditions, with high reliability.

Other objects and advantages of the invention will be apparent from the specification and claims when considered in connection with the attached sheet of drawings, illustrating one form of the invention, wherein like characters represent like parts and in which:

Figures 2, 3:
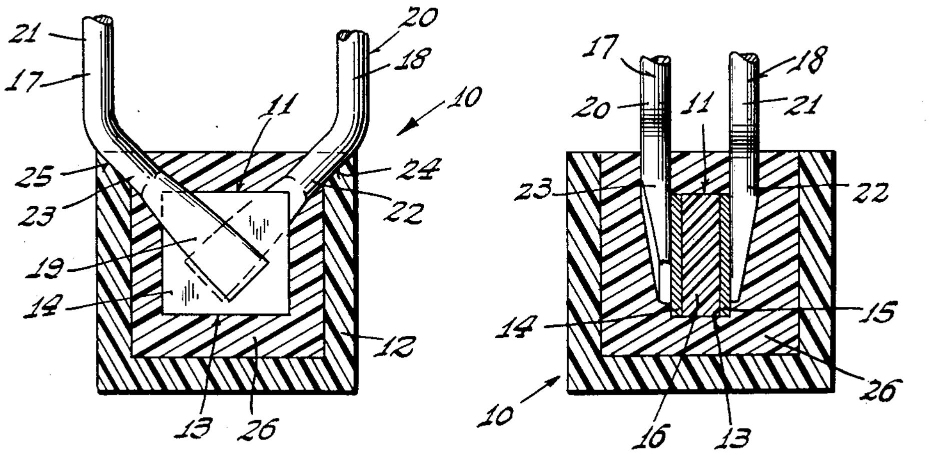
FIG. 2 is a front elevational view, in section, of an encapsulated assembly embodying the invention.
FIG. 3 is an end elevational view, in section of the encapsulated assembly of FIG. 2.
Figure 1:
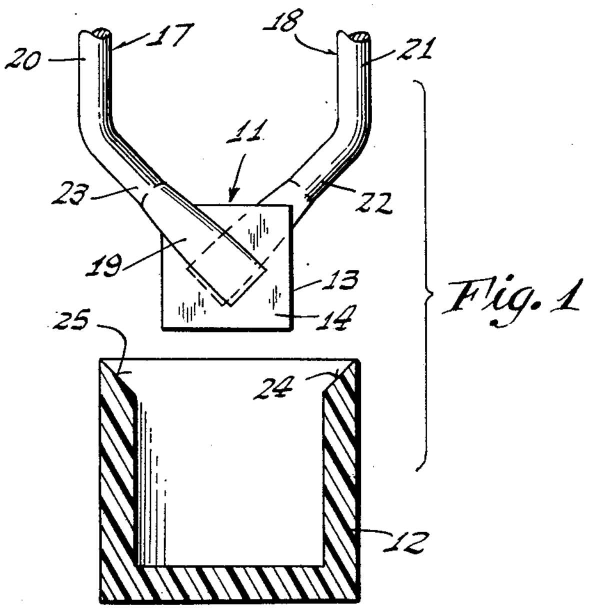
FIGURE 1 is an exploded view, in section, of an encapsulated assembly embodying the invention.

Referring now to the drawings for a detailed description of the invention, an encapsulated assembly is shown, generally indicated by the numeral 10, which includes an electrical component 11 having predetermined electrical properties and a casing 12 for housing the component.

Basically, the invention resides in an assembly in which the elements thereof cooperate to facilitate the manufacture of the assembly and assure the proper positioning of its component parts. While the invention is applicable to any encapsulated assembly, no matter whether the electrical component be a transistor, thermistor, resistor or combination of such units for purposes of explanation the component herein illustrated is a capacitor and comprises a body 13 including a pair of conducting plates 14 and 15 having a dielectric material 16 therebetween. In the present form of the invention the capacitor body 13 is rectangular in shape but it should be understood that, whether the component is a capacitor or other kind of electrical unit or a combination of units, such configuration may be varied without departing from the concepts of the invention.

Connected to the capacitor body 13 are a pair of leads 17 and 18, which as customary in the capacitor art, are connected, respectively, to the conducting plates 15 and 14. The leads, which are formed of copper or similar conducting wire and project from the body in substantially the same direction, in the preferred form of the invention are flattened as at 19 to reduce the size of the silhouette of the component and provide a greater area of electrical contact with the respective plates of the component so that the strength of the unit is enhanced.

It will be understood that lead wires projecting from an electrical component are normally spaced and so related to one another that they are adapted for a specific use. In the illustrated form of the invention the free ends 20 and 21 of the leads 17 and 18, respectively, lie parallel with one another and are spaced in multiples of tenths for use in printed circuits or the like having grids divided into multiples of tenths.

Prior to the present invention, electrical components, such as the capacitor 13 and the like, have been housed or encapsulated within casings to protect the component so that a rugged compact assembly is provided. In the prior art the encapsulation process has been relatively expensive and time consuming due to the difficulties encountered in positioning the component body within the casing so that it is substantially equally spaced from the walls thereof. Attempts have been made to overcome this problem by utilizing casings of substantially the same internal size as the external size of the component but, while such attempts have been met with reasonable success, they result in further increased cost of the finished assembly due to the fact that a different casing is required to match each different size or shape component being encapsulated.

The present invention has overcome the problems encountered in the prior art by providing an encapsulated assembly in which means are provided for properly positioning the component body within the casing during manufacture of the assembly and additionally maintaining the lead wires in their predetermined relationship relative to one another.

According to the invention, the lead wires 17 and 18 are provided with angularly divergent portions 22 and 23 respectively, for a purpose to be hereinafter explained. The casing 12 forms an open ended container. It may be of any configuration, but in the illustrated form of the invention it is rectangular in shape and is formed at its open end with angularly divergent portions 24 and 25 which are adapted to complement and engage the angularly divergent portions 22 and 23, respectively, of the lead wires 17 and 18 when the component body 13 is inserted through the open end and into the casing. It will be seen that, inasmuch as the body has a predetermined relation with the lead wires, it will be automatically properly positioned within the casing as the angularly divergent portions of the lead wires engage their respective angularly divergent portions of the casing.

An important advantage of the invention is that proper positioning of the component body within the casing is always achieved so long as the body is correctly associated with its leads and is smaller than the internal size of the casing. Thus, encapsulated assemblies may be formed according to the concepts of the invention in which the component body may be of a variety of sizes without utilizing a different casing for each component, as long as the leads projecting from the component include angularly divergent portions complementary to and engageable with the angularly divergent portion of the casing. Further, as illustrated, by utilizing a casing having side edges substantially in alignment with the axes of the leads, support is provided for the leads to hold them in predetermined relationship and the size of the assembly is maintained within the limits dictated by the use that is to be made of it.

In the manufacture of an encapsulated assembly 10, according to the invention, it has been found desirable to fill the voids in the assembly, which exist between the component body and the casing as a result of the latter being larger than the former, with material having insulating and shockproof characteristics. While any materials known to the art may be utilized for this purpose, I have found that by utilizing a casing of thermosetting plastic and a filling or potting material, shown at 26 in FIGS. 2 and 3, of an epoxy resin or the like, after a curing operation which fuses the two, a compact and extremely rugged assembly is formed.

Thus, among others, the several objects and advantages of the invention as aforenoted are achieved. Obviously numerous changes in the structure may be resorted to without departing from the spirit of the invention as defined by the claims.

I claim:

1. An encapsulated assembly comprising a substantially flat body having specific predetermined electrical properties, lead wires projecting beyond said body in substantially the same direction and having the free ends thereof parallel and predeterminately spaced, said lead wires each being formed with an angularly divergent portion relative to the other lead wire, and a unitary casing having an open end adapted to receive said body, said body being insertable within said casing through said open end and said lead wires projecting outwardly through said opening, said casing being provided with opposed angularly divergent means at said open end complementary to said angularly divergent portions of said lead wires and engageable therewith in the inserted position of said body, said angularly divergent portions of said lead wires and said angularly divergent means of said casing cooperating to properly position said body and limit insertion thereof, within said casing and maintain the predetermined spacing between the free ends of the lead wires.

2. An encapsulated assembly comprising a body having specific predetermined electrical properties, lead wires projecting beyond said body in substantially the same direction and having the free ends thereof predeterminately spaced, said lead wires each being formed with an angularly divergent portion relative to the other lead wire, and a rectangular casing open at one edge adapted to receive said body, said body being insertable within said casing through said one open edge and said lead wires projecting outwardly through said opening, said casing being formed with opposed angularly divergent portions at said one open edge complementary to said angularly divergent portions of said lead wires and engageable therewith in the inserted position of said body, said angularly divergent portions of said lead wires and said casing cooperating to properly position said body and limit insertion thereof within said casing and maintain the predetermined spacing between the free ends of the lead wires.

3. An encapsulated assembly comprising a substantially flat rectangular body having specific predetermined electrical properties, lead wires projecting beyond one edge of said body in substantially the same direction and having the free ends thereof predeterminately spaced, said lead wires each being formed with an angularly divergent portion relative to the other lead wire, a flat rectangular casing open at one edge adapted to receive said body, said body being insertable within said casing through said one open edge and said lead wires projecting outwardly through said opening, said casing being larger than said body and formed with opposed angularly divergent portions at said one open edge complementary to said angularly divergent portions of said lead wires and engageable therewith in the inserted position of said body, said angularly divergent portions of said lead wires and said casing cooperating to properly position said body and limit insertion thereof within said casing and maintain the predetermined spacing between the free ends of the lead wires and means unitable with said casing for filling the voids therein between said body and said casing so that said body is locked in position and protected.

4. An encapsulated capacitor assembly comprising a capacitor including at least two terminal plates separated by a dielectric material, lead wires connected to said terminal plates and projecting beyond said capacitor in substantially the same direction, said lead wires having the free ends thereof parallel and predeterminately spaced and each being formed with an angularly divergent portion relative to the other lead wire, and a unitary casing open at one end adapted to receive said capacitor, said capacitor being insertable within said casing through said open end and said lead wires projecting outwardly through said opening, said casing being formed with opposed angularly divergent portions at said one open end complementary to said angularly divergent portions of said lead wires and engageable therewith in the inserted position of said capacitor, said angularly divergent portions of said lead wires and said casing cooperating to properly position said capacitor and limit insertion thereof within said casing and maintain the predetermined spacing between the free ends of the lead wires.

5. An encapsulated assembly as in claim 3 in which the free ends of said lead wires are parallel, the axes of the parallel free ends of the lead wires being in alignment with the side edges of the casing.

References Cited in the file of this patent

UNITED STATES PATENTS

| | | |
|---|---|---|
| 2,017,842 | Conant | Oct. 22, 1935 |
| 2,698,372 | Patla | Dec. 28, 1954 |
| 2,830,698 | Coda | Apr. 15, 1958 |
| 2,894,316 | Genovese | July 14, 1959 |
| 2,899,611 | Bradley | Aug. 11, 1959 |
| 2,935,669 | Abeel | May 3, 1960 |

FOREIGN PATENTS

| | | |
|---|---|---|
| 1,057,693 | Germany | May 21, 1959 |